(12) United States Patent
Huang

(10) Patent No.: US 8,547,147 B2
(45) Date of Patent: Oct. 1, 2013

(54) POWER-ON-RESET CIRCUIT AND RESET METHOD

(75) Inventor: Lei Huang, Beijing (CN)

(73) Assignee: Fairchild Semiconductor Corporation, San Jose, CA (US)

(*) Notice: Subject to any disclaimer, the term of this patent is extended or adjusted under 35 U.S.C. 154(b) by 0 days.

(21) Appl. No.: 13/459,117

(22) Filed: Apr. 28, 2012

(65) Prior Publication Data

US 2012/0274369 A1 Nov. 1, 2012

(30) Foreign Application Priority Data

Apr. 28, 2011 (CN) .......................... 2011 1 0109551

(51) Int. Cl.
*H03L 7/00* (2006.01)

(52) U.S. Cl.
USPC .......................................... 327/143; 327/198

(58) Field of Classification Search
USPC .......................................... 327/142, 143, 198
See application file for complete search history.

(56) References Cited

U.S. PATENT DOCUMENTS

| | | | |
|---|---|---|---|
| 5,132,565 A * | 7/1992 | Kuzumoto | ....................... 326/34 |
| 5,321,317 A | 6/1994 | Pascucci et al. | |
| 5,534,804 A | 7/1996 | Woo | |
| 6,005,423 A | 12/1999 | Schultz | |
| 6,288,584 B1 | 9/2001 | Wu et al. | |
| 6,335,646 B1 | 1/2002 | Nagatomo | |
| 6,362,669 B1 | 3/2002 | Zhou et al. | |
| 6,747,492 B2 | 6/2004 | Govil et al. | |
| 6,784,704 B2 | 8/2004 | Sato | |
| 7,030,668 B1 * | 4/2006 | Edwards | ....................... 327/143 |
| 7,081,779 B2 | 7/2006 | Kang | |
| 7,164,300 B2 | 1/2007 | Hsu | |
| 7,190,212 B2 | 3/2007 | Shor | |
| 7,348,814 B2 | 3/2008 | Chen | |
| 7,564,278 B2 | 7/2009 | Chen | |
| 8,102,168 B1 * | 1/2012 | Wong | ............................. 323/314 |
| 2006/0170466 A1 * | 8/2006 | Park | .............................. 327/143 |

* cited by examiner

*Primary Examiner* — William Hernandez
(74) *Attorney, Agent, or Firm* — Schwegman Lundberg & Woessner P.A.

(57) ABSTRACT

Apparatus and methods for a power-on-reset (POR) circuit are provided. In an example, a (POR) circuit can include a self-bias module configured to provide a reference voltage, a feedback module configured to provide a feedback voltage, a comparison module configured to compare the feedback voltage to the reference voltage and to provide an output signal, an inverter configured to couple the output of the comparison module to an enable input of the self-bias module, and a switch module coupled to the inverter, wherein the switch module and the inverter are configured to disabled the self bias module when the feedback voltage exceeds the reference voltage.

12 Claims, 8 Drawing Sheets

S402 — In the early stage of power on, the switch module 208 is turned off, and then under the effect of $C_0$, the initial voltage of the output terminal of the comparison module 206 is at a low level, so the enable terminal of the self-bias module 202 connected through the inverter is at a high level, the self-bias module 202 is started and generates a reference voltage $V_{NG}$, and then the comparison module 206 is turned on S404 — In the late stage of the power on, when the $V_{FB}$ outputted by the feedback module 204 is greater than $V_{NG}$, the output of the comparison module 206 will be pulled up to a high level, and the switch module 208 is turned on to latch the high level, so the enable terminal of the self-bias module 202 connected through the inverter is at a low level, and then the self-bias module 202 is cut off

POWER-ON-RESET CIRCUIT AND RESET METHOD

CLAIM OF PRIORITY

This patent application claims the benefit of priority, under 35 U.S.C. Section 119, to Huang, Chinese Patent Application Serial Number 201110109551.8, entitled "POWER-ON-RESET CIRCUIT AND RESET METHOD THEREOF," filed on Apr. 28, 2011, which is hereby incorporated by reference herein in its entirety.

BACKGROUND

Generally, in the early stage of powering a circuit system, when the power supply voltage does not reach a stable expected state, the voltage and the logic state of many circuit components (such as semiconductor devices or the like) and circuit nodes are instable. To make the circuit system start the operation from the state expected by the designer after being powered each time, a Power-On-Reset (POR) circuit may be utilized during a certain period of time after the power supply is stable. The reset signal can force the circuit system to stay in the initial state expected by the designer. After the validity period of the reset signal expires, the circuit system starts the operation from the expected initial state. Namely, the POR circuit can make reset operations on other modules in the circuit system, to eliminate the instability of the circuit module in the initialization of the power-on.

In the related art, there have been various POR circuits, but they have large power consumption and instable performance. For example, FIG. 1 illustrates a schematic diagram of a POR circuit according to the related art. As shown in FIG. 1, the charge stored in the capacitor C1 is discharged to the power supply VDD through the resistor R1. Since values of both the resistor R1 and the capacitor C1 are relatively large, it takes a relatively long time to discharge completely the charge stored in the capacitor C1. If the power supply VDD is quickly powered on again immediately after previous power on failure, then the charge stored in the capacitor C1 cannot be discharged completely, and as a result, the voltage of the node 103 is relatively high, thus the square wave shaping circuit 101 always outputs high level and the POR signal POR1 cannot be generated effectively. Namely, when the power on is too slow to exceed the RC charging constant, the node 103 serves as the VDD all the time, so that POR signals cannot be generated correctively. In practical application, the power-on speed may range from 1 us to 10 ms, or be even more. In order to deal with the power-on with a speed of 10 ms or slower, large resistance or capacitance is needed to increase the product of RC (a large product of RC means long reset time).

It is thus clear that, in the above related art, due to the uncertainty of the rising speed of the power supply VDD, there is no guarantee that POR signals can be effectively generated in the circuit system in all cases, so the performance is unreliable.

OVERVIEW

Apparatus and methods for a power-on-reset (POR) circuit are provided. In an example, a (POR) circuit can include a self-bias module configured to provide a reference voltage, a feedback module configured to provide a feedback voltage, a comparison module configured to compare the feedback voltage to the reference voltage and to provide an output signal, an inverter configured to couple the output of the comparison module to an enable input of the self-bias module, and a switch module coupled to the inverter, wherein the switch module and the inverter are configured to disabled the self bias module when the feedback voltage exceeds the reference voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4 illustrates a flowchart of an example reset method for an example POR circuit.

DETAILED DESCRIPTION

The present subject matter is described in detail with reference to the accompanying drawings and in combination with the examples hereinafter. It should be noted that the examples and the features of the examples in the present application can be combined with each other under the circumstances that there is no conflict.

Figure 1:
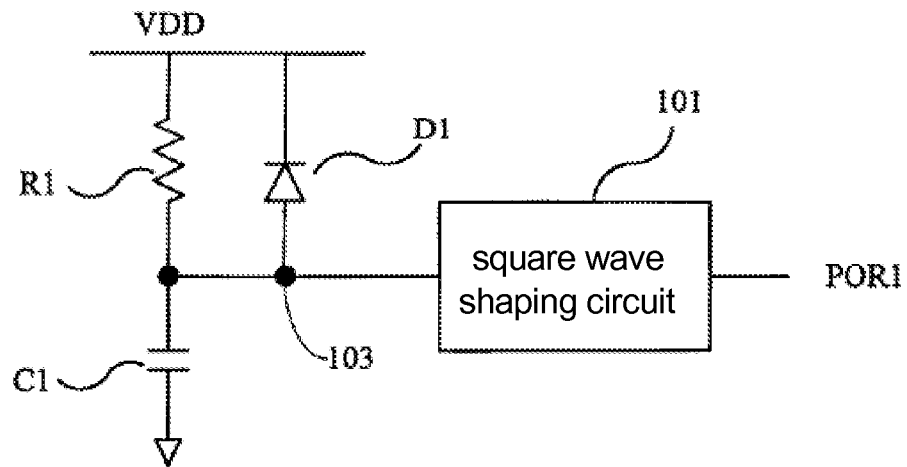
FIG. 1 illustrates a schematic diagram of a POR circuit according to the related art.
Figure 2:
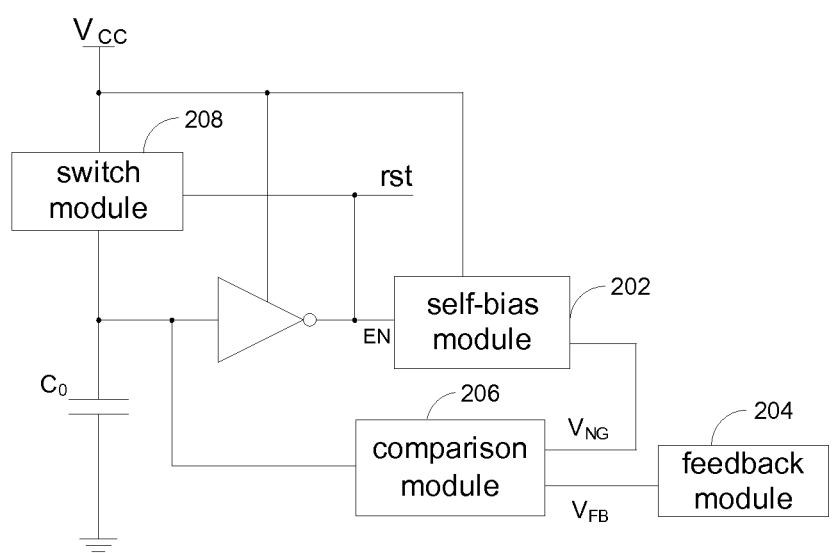
FIG. 2 illustrates generally a schematic diagram of an example POR circuit.

In certain examples, a POR circuit is provided. FIG. 2 illustrates generally a schematic diagram of an example POR circuit. As shown in FIG. 2, the POR circuit can include a self-bias module 202, a feedback module 204, a comparison module 206 and a switch module 208. Each module is described in detail below.

The self-bias module 202 can be connected with the comparison module 206 and can be configured to provide a reference voltage VNG to one input terminal of the comparison module 206 during the starting.

The feedback module 204 can be connected with the comparison module 206 and can be configured to provide a voltage VFB to the other input terminal of the comparison module 206.

The comparison module 206, the output terminal of which can be connected with the enable (EN) terminal of the self-bias module 202 through an inverter and can be grounded through a capacitor C0, can be configured to compare VFB with VNG in magnitude, and then can output a low level if VFB is less than VNG, and can output a high level if VFB is greater than VNG.

The switch module 208 can be connected with both the output terminal of the comparison module 206 and the output terminal of the inverter and can be configured to latch the input and output states of the inverter through the ON and OFF of the switch.

In certain examples, the feedback module 204 can provide to the comparison module 206 an input voltage VFB greater than the reference voltage VNG of the self-bias module 202, so that the output of the comparison module 206 can be pulled up to a high potential, thus the self-bias module 202 can be cut off without consuming power continuously, which can solve issues related to large power consumption and instable performance of the POR circuit in the related art, can enhance the reliability of the system, and can improve the performance of the system.

It is understood that, in the implementation process, the power supply voltage VCC can be the internal working pressure VDD (namely, the working voltage of the chip) of the device.

In an example, the feedback module 204 can be configured to provide a feedback voltage VFB, so as to generate an EN signal to end the POR circuit.

In certain examples, an EN control switch can be respectively provided in the self-bias module 202 and the comparison module 206, to control the opening and closing of the self-bias module 202 and the comparison module 206. In some examples, the EN of the comparison module 206 can be controlled by the self-bias module 202.

In certain examples, the feedback module 204 can include one of the following: a power supply voltage VCC resistance voltage divider circuit, a current source charging circuit and a bandgap circuit. In certain example methods, a voltage VFB compared with the VNG can be output to the comparison module 206. In certain examples, the size of the constitutional elements can be selected according to a delay constraint, so that the flexibility of the system can be improved. In some examples, a current source, that has low correlation with the power supply voltage, can be used for some purposes (namely, providing VFB). Since the current of the current source is low, a relatively long delay time can be obtained even if the current source is used for charging a small capacitor.

In certain examples, the feedback module 204 can be an external circuit in other reference feedback forms.

In some examples, the self-bias module 202 can be configured to provide a starting current for the feedback module 204 when the feedback module 204 is the current source charging circuit.

In an example, the self-bias module 202 can include an N-channel Metal-Oxide-Semiconductor field-effect transistor (NMOS) and a P-channel Metal-Oxide-Semiconductor field-effect transistor (PMOS), wherein the selection of the NMOS and the PMOS can determine the magnitude of VNG. By this method, the adaptability of the system can be improved.

In certain examples, the comparison module 206 can include a comparator, wherein the threshold of the comparator can be a tunable reference voltage generated by the self-bias module 202.

In some examples, the switch module 208 can include one PMOS transistor, wherein the source of the PMOS transistor can be connected with the power supply voltage VCC, the drain of the PMOS transistor can be connected with the output terminal of the comparison module 206, and the gate of the PMOS transistor can be connected with the EN terminal of the self-bias module 202. Such an example can decrease the power consumption.

Figure 3:
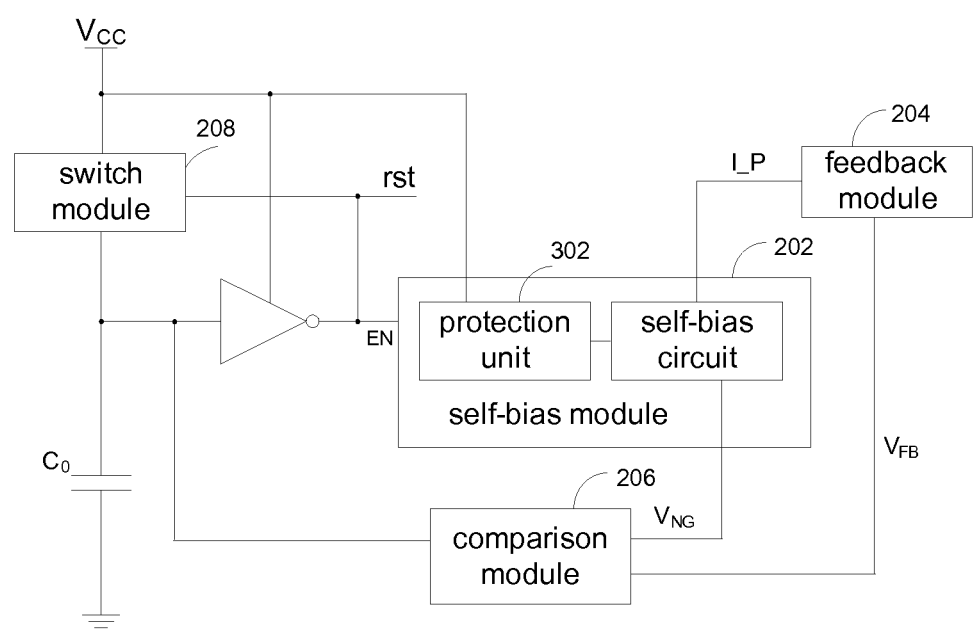
FIG. 3 illustrates generally a schematic diagram of an example POR circuit.

FIG. 3 illustrates generally an example POR circuit according to the present subject matter. The self-bias module 202 can include: a protection unit 302, configured to disconnect the self-bias circuit and the power supply voltage VCC when the internal power supply of the self-bias module 202 sharply drops, to protect the stable state of the self-bias module 202. In certain examples, the self-bias module 202 can output stable voltage during the power-on, which can improve the stability of the system.

In certain examples, the self-bias module 202 can provide a starting current to the feedback module 204 through an output terminal I_P. In some examples, the self-bias module 202 can function as a current source.

In some examples, the protection unit 302 can include one PMOS transistor to provide simplified operation and save cost.

In some examples, the inverter can include a Schmitt trigger to provide simplified implementation and high operability.

FIG. 4 illustrates a flowchart of an example reset method for a POR circuit according to examples of the present subject matter. In certain examples, the method can include the following steps.

At S402, in the early stage of the power-on, the switch module 208 can be off, and then under the effect of C0, the initial voltage of the output terminal of the comparison module 206 can be at a low level, so the EN terminal of the self-bias module 202 coming from the inverter can be at a high level, the self-bias module 202 can be started and can generate a reference voltage VNG, and then the comparison module 206 can be turned on.

At S404, in the late stage of the power-on, when the VFB outputted by the feedback module 204 is greater than VNG, the output of the comparison module 206 can be pulled up to a high level, and the switch module 208 can be turned on to latch the high level, so the EN terminal of the self-bias module 202 coming from the inverter can be at a low level, and then the self-bias module 202 can be cut off.

In certain examples, the execution of the steps described above can allow the feedback module 204 to provide an input voltage VFB greater than the reference voltage VNG of the self-bias module 202 to the comparison module 206, so that the output of the comparison module 206 can be pulled up to a high potential, thus the self-bias module 202 can be cut off without consuming power continuously, which can solve issues of the large power consumption and instable performance of the POR circuit in the related art, can reduce the cost of the design and development, can enhance the reliability of the system, and can improve the performance of the system.

Figure 5:
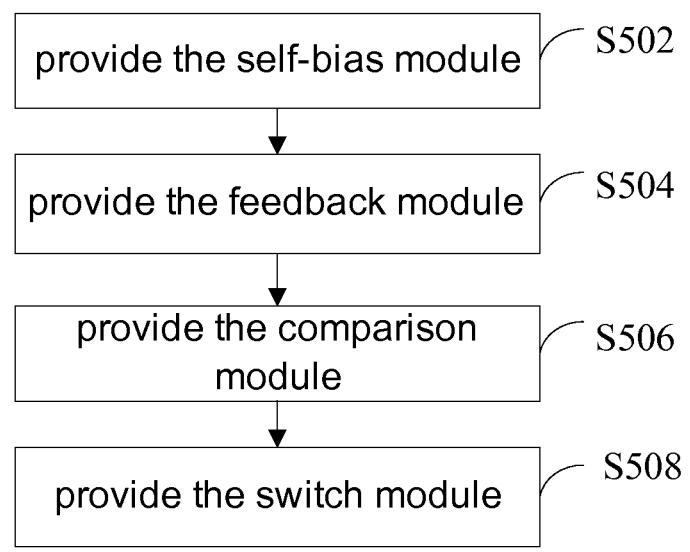
FIG. 5 illustrates a flowchart of an example reset method for an example POR circuit.

FIG. 5 illustrates generally a flowchart of an example reset method for a POR circuit according to the present subject matter. In certain examples, the method can include the following:

At S502, a self-bias module 202, such as a self-bias module 202 respectively connected with a comparison module 206 and a feedback module 204, can be configured to provide a reference voltage VNG to one input terminal of the comparison module 206, and to provide a starting current to the feedback module 204 during the starting.

At S504, the feedback module 204, that can be connected with the comparison module 206, can be configured to provide a voltage VFB to the other input terminal of the comparison module 206.

At S506, the comparison module 206, that can have an output terminal of connected with the EN terminal of the self-bias module 202 through an inverter and is grounded through a capacitor C0, can be configured to compare VFB with VNG in magnitude, and to output a low level if VFB is less than VNG, and to output a high level if VFB is greater than VNG.

At S508, a switch module 208, that can be connected with both the output terminal of the comparison module 206 and the output terminal of the inverter, can be configured to latch the input and output states of the inverter through the ON and OFF of the switch.

In certain examples, the execution of the steps described above can allow the feedback module 204 to provide an input voltage VFB greater than the reference voltage VNG of the self-bias module 202 to the comparison module 206, so that the output of the comparison module 206 can be pulled up to a high potential, thus the self-bias module 202 can be cut off without consuming power continuously, which solves issues related to large power consumption and instable performance of the POR circuit in the related art, can reduce the cost of the design and development, can enhance the reliability of the system, and can improve the performance of the system.

It is understood that, in certain examples, the POR circuit not only can provide POR signals to the external circuits, but also can be used as a starting circuit for the circuits. In addition, the POR circuit can be turned off by itself without consuming power continuously after being powered on.

In certain examples, a POR circuit can provide POR signals for its internal circuits and can be used for the circuits to provide a starting circuit. IN certain examples, the internal self-bias circuit can be used to provide a starting circuit for a bandgap circuit.

Figure 6:
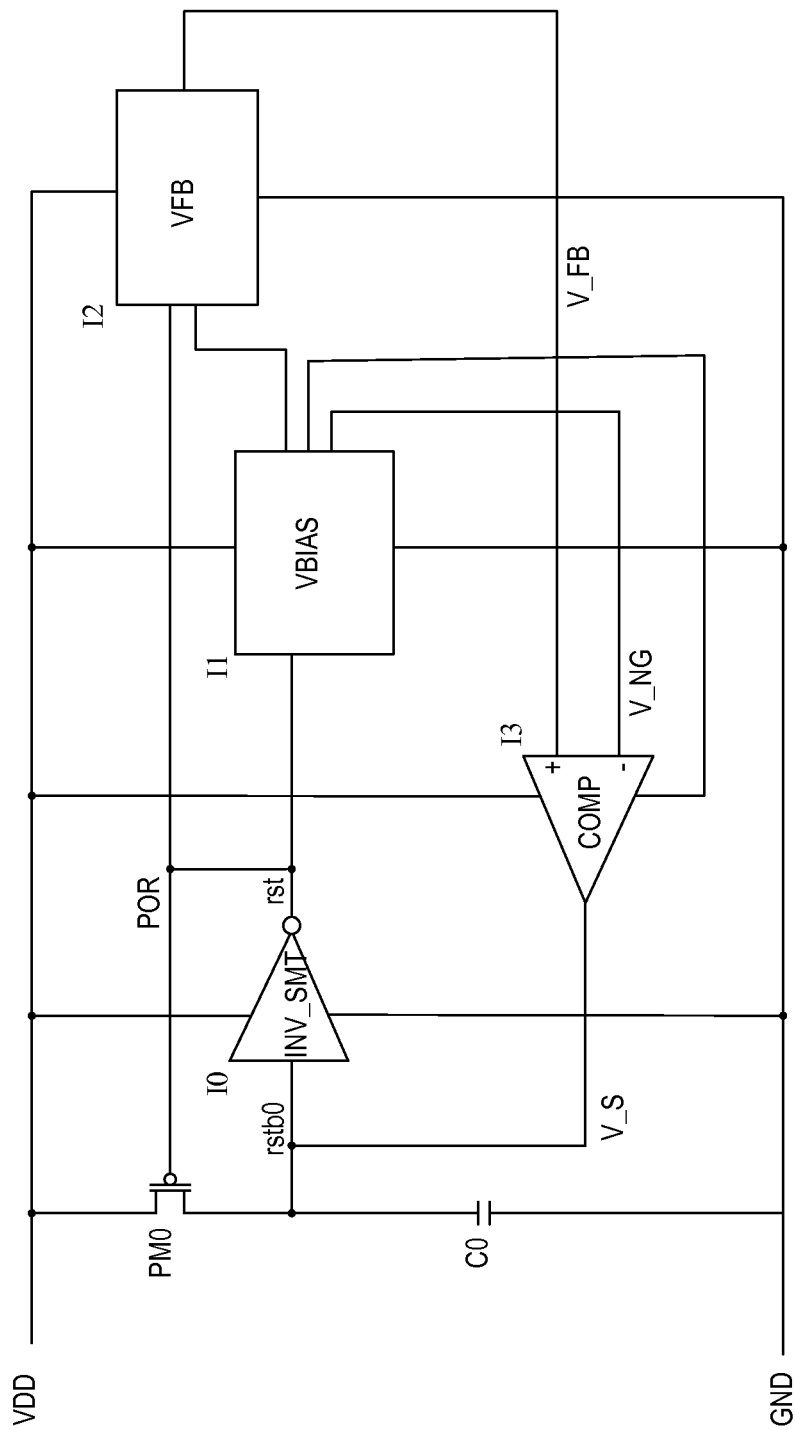
FIG. 6 illustrates generally an example POR circuit.

FIG. 6 illustrates generally an example POR circuit. In certain examples, C0 can be used to keep the initial voltage of the rstb0 at low potential during the power on (e.g., POR initial state), and the rst signals can be obtained by a Schmitt inverter (INV_SMT); and the PM0 (e.g., switch module 208) can be used to latch the POR ended state.

In the early stage of the power on, due to the presence of C0, the initial voltage of V_S can be at a low level, so that the voltage of POR can be at a high level, and then the VBIAS module (e.g., self-bias module 202) can be enabled to generate the voltage of V_NG; after the voltage of V_FB outputted by the VFB module (e.g., feedback module 204) is higher than the voltage of V_NG, the voltage of V_S can be pulled up by the comparator (COMP, e.g., comparison module 206), and the voltage of POR can become low, and then the PM0 and 10 enter the latched state, and the self-bias circuit and the comparator can be turned off to enter the state with zero power consumption.

It is understood that, in some examples, the conclusion of the starting of the POR circuit can be determined by the comparator. When the feedback voltage V_FB is higher than the voltage value of the V_NG (e.g., reference voltage of the VBIAS), the output terminal rstb0 of the comparator can be at high potential and rst can be at low potential, and then the self-bias circuit can be cut off, and the POR circuit can be latched as the ended state, thus achieving zero power consumption.

In certain examples, the pulse width generated by the POR can depend on the rising speed of the voltage of V_FB of the feedback signal. In this way, it can be ensured that the voltage V_FB will not end until rising up to V_NG. I some examples, a proper voltage value of the V_NG can be selected to guarantee the starting of the bandgap circuit (e.g., feedback module 204).

In certain examples, the threshold (e.g., V_NG) of the POR power supply voltage can be set by selecting the level value of the internal voltage VDD, the voltage of V_FB can be obtained from VDD resistor voltage divider, and when the bandgap voltage V_FB is higher than the voltage value of V_NG, the POR process ends, and the self-bias circuit can be turned off.

Figure 7:
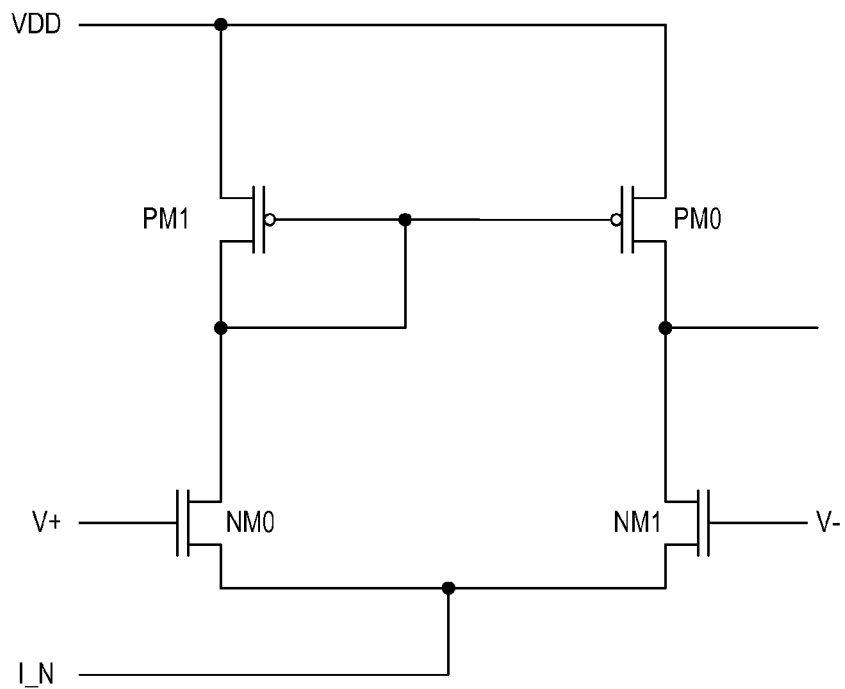
FIG. 7 illustrates generally an example comparator circuit for the POR circuit of FIG. 6.

FIG. 7 illustrates generally a schematic diagram of a comparator circuit according to an example of the present subject matter. In certain examples, the comparator (COMP) can include a PM1, a PM0, an NM0 and an NM1, and the input terminal V+ of the COMP can be connected with the output node V_FB of the VFB module, the input terminal V− can be connected with the reference voltage node V_NG of the VBIAS module, the tail current I_N can come from the self-bias circuit in the VBIAS module, and the output terminal VO can be connected with the input terminal V_S of the inverter.

In certain examples, the comparator COMP can solve issues related to the rising speed of VDD being slow in the related art, and there is little to no power consumption of a system including the comparator COMP after finishing the power on.

Figure 8:
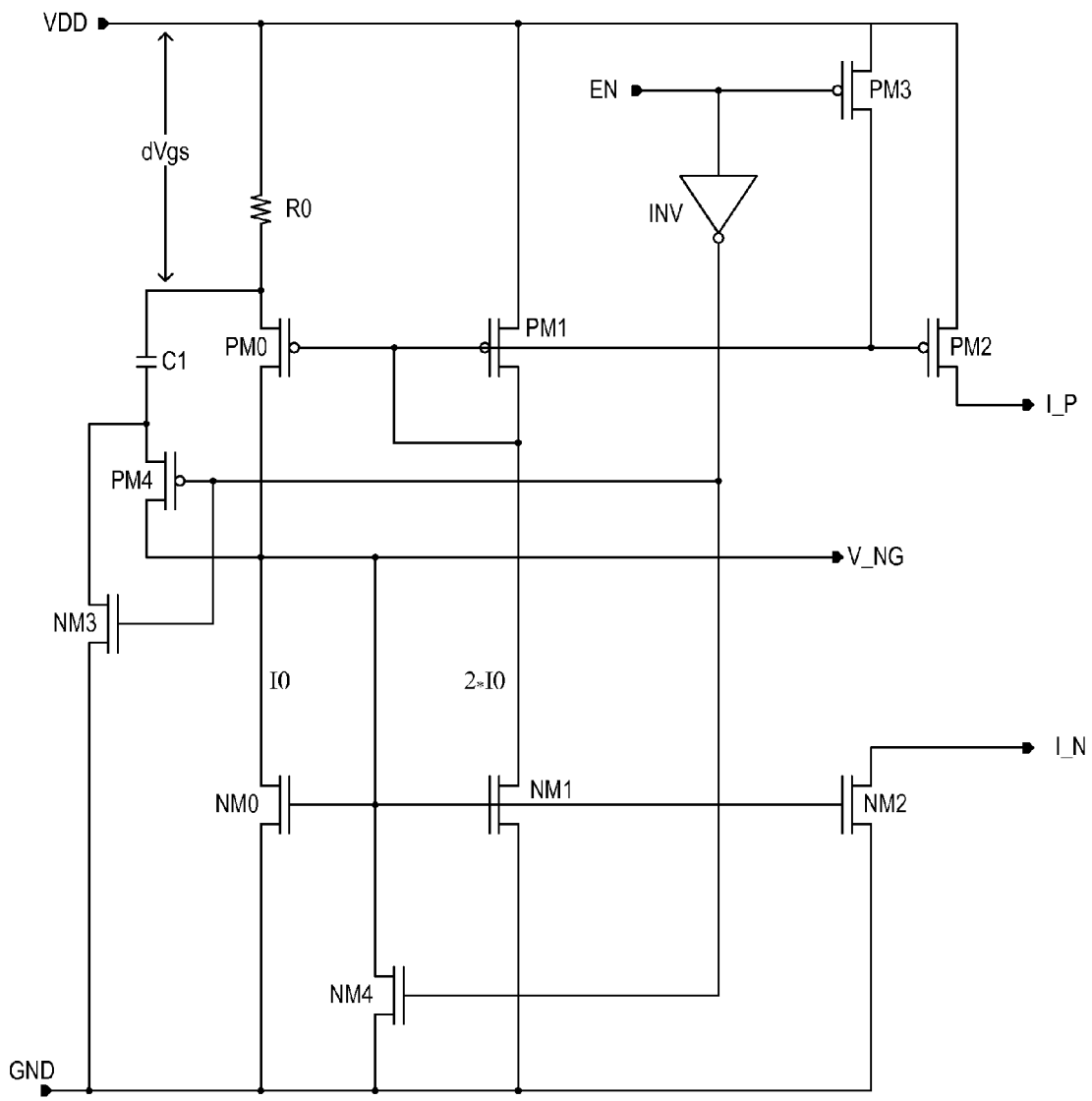
FIG. 8 illustrates generally an example self-bias circuit.

FIG. 8 illustrates generally a schematic diagram of a example self-bias circuit for a POR circuit according to examples of the present subject matter. In an example, the self-bias circuit can include a PM0, a PM1, an NM0, an NM1 and an R0. In certain examples, the voltage value of the V_NG can be changed by selecting different cascode MOS transistors; the PM4 and C1 can be used to start the self-bias circuit; PM3, NM4 and I9 can be used to turn the self-bias circuit off after the starting process ends (e.g., EN is a enable signal which is effective and at the high level); and NM3 can be used to connect the negative node of C1 to the ground after the starting process ends.

In certain examples, after being powered, in the quick rising or dropping stage, the internal working voltage VDD can drop sharply if the capacitor C1 is directly coupled to the self-bias circuit. When the internal voltage drops sharply, the self-bias circuit can be turned off. In certain examples, the PM4 (e.g., protection module 302) can be used to avoid turning off the self-bias circuit when the internal voltage VDD drops sharply. When the POR is still in the initial state, the self-bias circuit can work, wherein the starting of the self-bias circuit includes the C1 and the PM4. In certain examples, as the threshold of the PM4 is higher than the voltage value of the V_NG, the PM4 can be used to prevent the self-bias circuit from being cut off due to the suddenly dropping of the power supply and the coupling of the C1. In some examples, after the self-bias circuit is started, the generated current source can be used to start other circuits. For example, the current source generated by the starting of the self-bias circuit can be used to start the bandgap circuit, to obtain the feedback voltage V_FB (e.g., the generated current source can be used to start the VFB module to output the voltage VFB).

In certain examples, the capacitor C1 is not directly coupled to the gate of the self-bias element NM4, instead, it can be coupled to the gate of the NM4 via the PM4. As the voltage of the gate of the NM4 can be pulled up to a high level during the power on to turn on the NMOS transistor, so as to start the self-bias circuit. If there is a sudden power supply voltage drop during the power on, the voltage of the negative node of the capacitor C1 can drop down to be less than the voltage of the gate of the NM4, which can be coupled to the gate of the NM4 by the capacitor C1, and then can cause the self-bias circuit to turned off. The PM4 can be added to solve this problem. In certain examples, if the power supply voltage sharply drops during the power on, the PM4 can be turned off and can have high impedance because the PMOS transistor PM4 can have a higher threshold voltage (Vth) than the NMOS transistor NM4.

In certain examples, the capacitor C1 can start the self-bias circuit by coupling the PMOS transistor PM4 to the gate of the NM0, wherein the PMOS transistor PM4 can be used to protect the internal power supply VDD after a power on failure. As a result, the circuit does not employ a large RC, which can reduce the area of the circuit.

In certain examples, different rates of the voltage dVgs (ΔVgs) can be obtained by the selection of NMOSs and PMOSs in the self-bias circuit, e.g., I0=dVgs/R0.In some examples, where dVgs is small, small resistors and capacitors can have a long POR delay, and the current can be mirrored to start other circuits, such as the self-bias circuit or the bandgap circuit. Due to a small fixed starting current, not directly related to the power supply voltage VCC, the bandgap circuit can perform without a sharp spike to that can cause instability of the circuit during the starting period. In certain examples, smaller resistors and capacitors can reduce the circuit area. In certain examples, the POR delay time to smoothly start the bandgap circuit can be set by the selection of resistors and capacitors, particularly the bandgap circuit that is operated at low current.

In certain examples, if a purpose is to provide the rst signal to the digital circuits, I_P can be used to charge the capacitors and then feed back to the I_P pin of the VFB module. In some examples, this delay can be controlled by the values of the current and the capacitance and the speed of the comparator.

Figure 9:
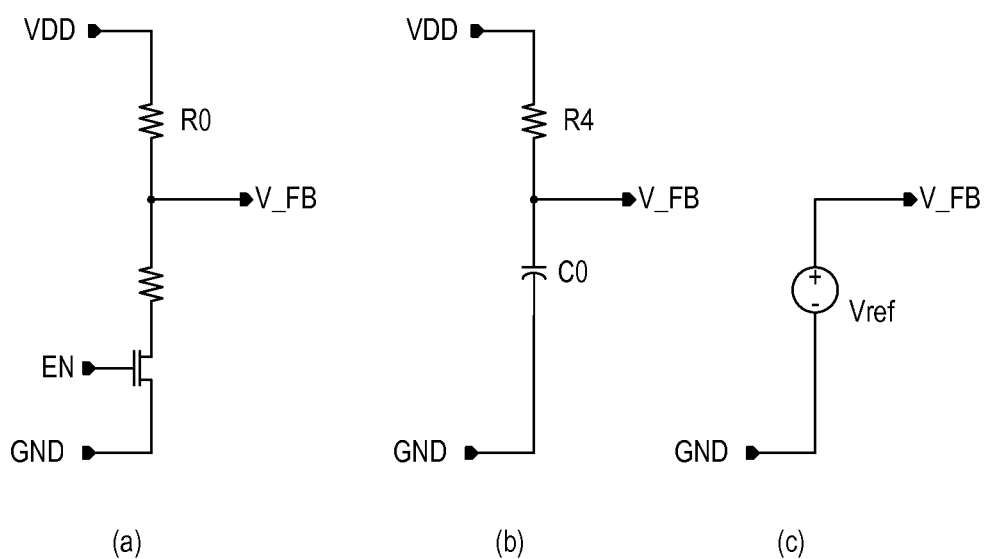
FIG. 9 illustrates generally examples of starting circuits.

FIG. 9 illustrates generally an example starting circuit providing a monitored node voltage according to examples of the present subject matter. In certain examples, the voltage (e.g., VFB) of the monitored node V_FB of a POR circuit can be acquired in the following ways: (a) VDD resistance voltage dividing, namely, the resistance voltage divider sensing the VDD level; (b) current power charging: in which charging can be performed by capacitors to obtain the delayed current source; (c) externally providing other reference feedbacks: in which the POR circuit itself consumes no power (but other reference circuits can consume power), for example, the output of the bandgap circuit. In addition, V_FB can be acquired from any node, the final stable voltage of which is higher than the internal voltage value of the V_NG (to complete the POR).

In certain examples, when the starting circuit of the monitored node voltage (the output voltage V_FB of the feedback module 204) is employed as illustrated in FIG. 9(a), and as shown in FIG. 6, the starting circuit can be enabled by the POR signal.

In some examples, a POR circuit can include a comparator using a tunable reference voltage as the threshold. For example, the tunable reference voltage can be provided by the self-bias circuit.

In certain examples, the reset method of the POR circuit can have two stages (phases) including an initial state stage and a state latched stage. As illustrated in FIG. 6, the first stage, during power on, under the effect of C0, the initial state voltage of the rstb0 is '0' (namely, in the low potential or a low level), and at this moment, the self-bias circuit is started, and the comparator is turned on; and the second stage is: until the monitored node voltage V_FB is higher than the voltage value of the V_NG, the rstb0 is not pulled up to '1'(namely, in the high potential or a high level) by the fixed current (tail current of the comparator), and after the rstb0 is pulled up to the high potential, the rst is at the low potential, and the rstb0 is latched at the high potential by the PMOS transistor PM0, and the self-bias circuit is cut off. It has to be noted that the input and output state of the Schmitt trigger (namely, inverter) have lagging.

In certain examples, after the POR of the POR circuit is completed, the rst and the rstb0 will automatically turn off the self-bias circuit, so that it does not consume power. Furthermore, the POR circuit can work under a relatively low power supply voltage, and the duration of the POR can be configured.

In certain examples, the circuit element identifier 'PM' indicates PMOS transistor and 'NM' indicates NMOS transistor.

In certain examples, an example POR circuit can be used not only to start the self-bias circuit, but also to generate a POR signal for other circuits (such as the self-bias circuit) by monitoring the voltage of nodes (rstb0 or rst). Furthermore, in some examples, less resistors and capacitors are used thus the area of the chip can be conserved, and the use of large resistors and capacitors in the related art to provide a longer POR delay can be avoided.

In certain examples, modules and methods of the present subject matter can be realized by using general purpose calculating device, can be integrated in one calculating device or distributed on a network which can include a plurality of calculating devices. In certain examples, the modules and methods can be realized by using the executable program code of the calculating device. Consequently, the program code of the modules and methods can be stored in the storing device and executed by the calculating device, or they be incorporated into one or more integrated circuit modules without restriction to any particular hardware and software combination.

Additional Notes & Examples

In certain examples a POR circuit can provide a reset solution to large power consumption and instable performance of POR circuits in the related art. in certain examples a POR circuit can include a self-bias module, a feedback module, a comparison module and a switch module, wherein the self-bias module, connected with the comparison module, is configured to provide a reference voltage VNG to one input terminal of the comparison module during the starting; the feedback module, connected with the comparison module, is configured to provide a voltage VFB to the other input terminal of the comparison module; the comparison module, the output terminal of which is connected with the enable terminal of the self-bias module through an inverter and is grounded through a capacitor C0, is configured to compare VFB with VNG in magnitude, and then to output a low level if VFB is less than VNG, and to output a high level if VFB is greater than VNG; and the switch module, connected with both the output terminal of the comparison module and the output terminal of the inverter, is configured to latch the input and output states of the inverter through the ON and OFF of the switch.

In an example, the feedback module con include one or more of the following: a power supply voltage VCC resistance voltage divider circuit, a current source charging circuit or a bandgap circuit.

In an example, the self-bias module is optionally configured to provide a starting current for the feedback module when the feedback module is the current source charging circuit.

In an example, the self-bias module optionally includes a N-channel Metal-Oxide-Semiconductor field-effect transistor (NMOS) and a P-channel Metal-Oxide-Semiconductor field-effect transistor (PMOS), wherein the selection of the NMOS and the PMOS decides the magnitude of VNG.

In an example, the comparison module optionally includes a comparator, wherein the threshold of the comparator is a tunable reference voltage generated by the self-bias module.

In an example, the switch module optionally includes one PMOS transistor, wherein the source of the PMOS transistor can be connected with the power supply voltage VCC, the drain of the PMOS transistor can be connected with the output terminal of the comparison module and the gate of the PMOS transistor can be connected with the enable terminal of the self-bias module.

In an example, the self-bias module optionally includes: a protection unit, configured to disconnect the self-bias circuit and the power supply voltage VCC when the internal power supply of the self-bias module sharply drops, to protect the stable state of the self-bias module.

In an example, the protection unit optionally includes one PMOS transistor.

In an example, a reset method for using a POR circuit can include the following steps: in the early stage of power on, the switch module is turned off, and then under the effect of C0, the initial voltage of the output terminal of the comparison module is at a low level, so the enable terminal of the self-bias module coming from the inverter is at a high level, the self-bias module is started and generates a reference voltage VNG, and then the comparison module is turned on; and in the late stage of the power on, when the VFB outputted by the feedback module is greater than VNG, the output of the comparison module will be pulled up to a high level, and the switch module is turned on to latch the high level, so the enable terminal of the self-bias module coming from the inverter is at a low level, and then the self-bias module is cut off.

In an example, The reset method for a POR circuit optionally includes providing a self-bias module, which is connected with a comparison module to provide a reference voltage VNG to one input terminal of the comparison module during the starting; providing a feedback module, which is connected with the comparison module to provide a voltage VFB to the other input terminal of the comparison module; providing the comparison module, the output terminal of which is connected with the enable terminal of the self-bias module through an inverter and is grounded through a capacitor C0, configured to compare VFB with VNG in magnitude, and then to output a low level if VFB is less than VNG, and to output a high level if VFB is greater than VNG; and providing a switch module, which is connected with both the output terminal of the comparison module and the output terminal of the inverter to latch the input and output states of the inverter through the ON and OFF of the switch.

In an example, the feedback module can optionally provide an input voltage VFB greater than the reference voltage VNG of the self-bias module to the comparison module, so that the output of the comparison module can be pulled up to a high potential, thus the self-bias module is cut off without consuming power continuously, which can ameliorate issues of the large power consumption and instable performance of the POR circuits in the related art, can reduce the cost of the design and development, can enhance the reliability of the system, and improves the performance of the system.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments The claimed invention is:

1. A power-on reset (POR) circuit, comprising
   a self-bias module configured to provide a reference voltage;
   a feedback module configured to provide a feedback voltage;
   a comparison module including inputs configured to receive the reference voltage and the feedback voltage and an output configured to provide an output signal, wherein the comparison module is configured to compare the feedback voltage to the reference voltage and to provide an output signal having a first level if the magnitude of the feedback voltage is less than magnitude of the reference voltage and a second level if the magnitude of the feedback voltage is greater than magnitude of the reference voltage;
   an inverter configured to couple the output of the comparison module to an enable input of the self-bias module; and
   a switch module coupled to the inverter, wherein the switch module and the inverter are configured to disabled the self bias module when the feedback voltage exceeds the reference voltage.

2. The POR circuit of claim 1, wherein the switch module is configured to latch the output of the inverter when the feedback voltage exceeds the reference voltage.

3. The POR circuit of claim 1, including a capacitor coupled between the output of the comparison module and ground.

4. The POR circuit of claim 1, wherein the feedback module includes one of a voltage divider, a current source charging circuit, or a bandgap circuit.

5. The POR circuit of claim 1, wherein the feedback module includes a current source charging circuit; and
   wherein the self-bias module is configured to provide a starting current for the feedback module.

6. The POR circuit of claim 1, wherein the self-bias module includes a N-channel Metal-Oxide-Semiconductor field-effect transistor (NMOS) and a P-channel Metal-Oxide-Semiconductor field-effect transistor (PMOS); and
   wherein the selection of the NMOS and the PMOS determines a magnitude of the reference voltage.

7. The POR circuit according to claim 1, wherein the comparison module includes a comparator; and
   wherein the self-bias module is configured to provide an adjustable reference voltage.

8. The POR circuit of claim 1, wherein the switch module includes a PMOS transistor including a source, a drain and a gate,
   wherein the source of the PMOS transistor is coupled with a power supply voltage;
   wherein the drain of the PMOS transistor is coupled with the output of the comparison module; and
   wherein the gate of the PMOS transistor is coupled with the enable input of the self-bias module.

9. The POR circuit of claim 1, wherein the self-bias module includes:
   a protection unit configured to disconnect the self-bias circuit from a power supply voltage when the power supply voltage sharply drops to protect a stable state of the self-bias module.

10. The reset circuit according to claim 9, wherein the protection unit includes a PMOS transistor.

11. A power-on reset (POR) method comprising
    providing a reference voltage using a self-bias module;
    providing a feedback voltage using a feedback module;
    receiving the reference voltage and the feedback voltage at inputs of a comparison module
    comparing the feedback voltage with the reference voltage using the comparison module
    providing an output signal at an output of the comparison module, the output signal having a first level if the magnitude of the feedback voltage is less than magnitude of the reference voltage and a second level if the magnitude of the feedback voltage is greater than magnitude of the reference voltage;
    disabling the self bias module when the feedback voltage exceeds the reference voltage using an inverter and a switch module.

12. The POR method of claim 11, including latching an output of the inverter when the feedback voltage exceeds the reference voltage.

* * * * *